United States Patent [19]
Heflinger

[11] Patent Number: 5,530,348
[45] Date of Patent: Jun. 25, 1996

[54] MAGNETOMETER FOR DETECTING THE INTENSITY OF A PRESENT MAGNETIC FIELD

[75] Inventor: Lee O. Heflinger, Torrance, Calif.

[73] Assignee: TRW Inc., Redondo Beach, Calif.

[21] Appl. No.: 459,078

[22] Filed: Jun. 2, 1995

Related U.S. Application Data

[62] Division of Ser. No. 102,443, Aug. 5, 1993, Pat. No. 5,451,874.

[51] Int. Cl.$^6$ ...................................................... G01V 3/00
[52] U.S. Cl. ............................................. 324/301; 324/300
[58] Field of Search ...................................... 324/300, 301, 324/302, 306, 309, 318, 322

[56] References Cited

U.S. PATENT DOCUMENTS

| | | | |
|---|---|---|---|
| 2,845,595 | 7/1958 | Leete | 324/0.5 |
| 3,462,676 | 8/1969 | Takeuchi et al. | 324/0.5 |
| 3,564,399 | 2/1971 | Laukien | 324/0.5 |
| 3,568,047 | 2/1971 | Look et al. | 324/0.5 |
| 3,646,429 | 2/1972 | Takeuchi et al. | 324/0.5 R |
| 3,810,001 | 5/1974 | Ernst | 324/0.5 R |
| 3,999,118 | 12/1976 | Hoult | 324/0.5 A |
| 4,050,009 | 9/1977 | Sagalyn et al. | 324/0.5 AC |
| 4,682,107 | 7/1987 | Bendall et al. | 324/307 |
| 4,988,947 | 1/1991 | Ugurbil et al. | 324/307 |
| 5,001,427 | 3/1991 | Fujiwara | 324/307 |
| 5,101,158 | 3/1992 | Hall et al. | 324/309 |
| 5,103,175 | 4/1992 | Kimmich et al. | 324/309 |
| 5,117,186 | 5/1992 | Burum et al. | 324/307 |
| 5,122,748 | 6/1992 | Oh et al. | 324/309 |
| 5,136,243 | 8/1992 | Starewicz et al. | 324/301 |
| 5,150,052 | 9/1992 | Meyerand | 324/309 |
| 5,162,734 | 11/1992 | Rapoport | 324/307 |
| 5,162,737 | 11/1992 | Nozokido et al. | 324/309 |
| 5,198,767 | 3/1993 | Glenat et al. | 324/301 |
| 5,357,199 | 10/1994 | Leger et al. | 324/301 |
| 5,451,874 | 9/1995 | Heflinger | 324/309 |

*Primary Examiner*—Louis M. Arana

[57] ABSTRACT

A magnetometer is provided for detecting the intensity of a present magnetic field. The magnetometer includes a sample having a known resonance frequency response. A first source is provided for applying a first oscillating magnetic field having a first frequency to the sample. A second source is provided for applying a second oscillating magnetic field having a second frequency to the sample in a direction substantially transverse to the first oscillating magnetic field. A receiver is provided for detecting a frequency response output from the sample which is dependent upon the intensity of a present magnetic field so as to measure the intensity of the present magnetic field.

9 Claims, 4 Drawing Sheets

MAGNETOMETER FOR DETECTING THE INTENSITY OF A PRESENT MAGNETIC FIELD

This application is a divisional of U.S. patent application Ser. No. 08/102,443, filed Aug. 5, 1993 now U.S. Pat. No. 5,451,874.

BACKGROUND OF THE INVENTION

1. Technical Field

This invention relates generally to methods for producing gyromagnetic resonance and, more particularly, to an improved method and apparatus for providing heterodyne pumping of nuclear magnetic resonance which reduces drive interference and enables observation while exciting a sample.

2. Discussion

Nuclear magnetic resonance is a well known phenomenon in which resonance exhibited by nuclei in a wide variety of atoms reveals information about a sample such as the determination of the molecular structure thereof. This phenomenon has become a valuable tool for use in medical and chemistry laboratory instrumentation devices which include magnetic resonance imaging (MRI) and nuclear magnetic resonance spectrometers. Generally speaking, nuclear magnetic resonance is based upon the existence of magnetic forces or moments attributed to quantized nuclear spins, which when placed in a magnetic field, give rise to distinct nuclear Zeeman energy levels between which spectroscopic transitions can be induced.

It is generally known in the art that when an applied radio-frequency (RF) radiation signal matches the natural transition or resonating frequency for a given nuclei, the resulting interaction is detected as a resonance. That is, nuclear magnetic resonance occurs in the sample when the angular velocity of the RF field equals the angular velocity of the precession of the vector representing the magnetic moment of the sample about the direction of the polarizing field. A more detailed description of magnetic resonance theory is presented in U.S. Pat. No. 2,845,595 issued on Jul. 29, 1958 to Leete entitled "Apparatus For Measuring Electrical Quantities" and which is hereby incorporated by reference.

To induce and observe nuclear magnetic resonance, a number of conventional techniques have been developed. These techniques generally involve placing a sample in a unidirectional direct current (DC) or static magnetic field so as to align the nuclei of atoms making up the sample. One conventional approach for observing nuclear magnetic resonance is commonly known as the Bloch method (or stanford technique) which is based on the well known Bloch equation. According to this approach, a transmitting coil and receiving coil are located near the sample, each having an axis oriented perpendicular to one another and the static magnetic field. The transmitting coil supplies a radio frequency (RF) drive magnetic field transverse to the direction of the static magnetic field so as to induce a nuclear magnetic resonance response from the sample (i.e., pumping the sample). When the RF drive field frequency matches the resonance frequency of the sample, a resonance is produced which is then detected as a voltage induced on the receiving coil.

However, it is often the case that the magnetic field produced from the nuclei may be more than a million times weaker than the drive magnetic field. It is therefore generally necessary to provide for an arrangement whereby the relatively weak signal induced in the receiving coil by the magnetic field of the nuclei is not obliterated or overly interfered with by the strong drive magnetic field. This type of situation in which the drive signal contaminates the received signal is commonly referred to as the drive contamination problem.

According to the prior art, a number of approaches have been used to reduce the drive contamination induced in the receiver coil. One approach is referred to as a time sequencing arrangement which gives rise to a number of pulsed techniques. According to the time sequencing approach, no observation is made of the nuclei while the drive signal is "on" since the nuclear signal would otherwise likely be obliterated due to the strong drive signal induced in the receiver coil. However, it is generally known that the excited nuclei continue to supply a magnetic field for a short interval after the drive signal is turned off. Accordingly, the observation of nuclei by the receiver coil can be made during this interval following the turn off of the drive signal. In practice, there is also a very short interval following the turn off when observation of the nuclear signal may be impossible because the receiver electronics typically do not recover immediately from the strong drive signal.

A second and a third method for reducing drive contamination have commonly been used for continuous wave (CW) or steady state techniques in which the drive signal is applied to the sample at the same time that the nuclei are simultaneously observed. According to the second technique, the drive coil is arranged so that the magnetic field thereof is perpendicular to the axis of the receive coil. In principle, true perpendicularly would eliminate the drive contamination. However, in practice, true perpendicularity requires very precise geometrical adjustment of the drive and receiver coils. In addition, precise adjustments are difficult to maintain in order to minimize the drive contamination to a level where the nuclear signal is usefully observable.

The third technique is somewhat similar to the second approach except a single coil is used in place of the drive and receive coils for providing both the drive and receive operations. According to this approach, a bridge circuit having a compensation coil is used to introduce a signal from the drive source into the output signal so as to cancel the drive signal contamination picked up by the coil. However, this technique also requires a very precise circuit arrangement with a careful adjustment of the component values thereof in order to achieve adequate cancellation of the drive signal associated therewith.

Another method of producing gyromagnetic resonance is described in U.S. Pat. No. 3,462,676 issued to Makoto Takeuchi et al, which provides a method of exposing a sample to an RF magnetic field normal to a polarizing magnetic field while superimposing a modulating audio frequency field on the polarizing field. Magnetic resonance response is detected when the sum of the frequencies of the RF magnetic field and modulating audio field equals the resonating frequency of the sample. This approach, however, requires an RF frequency that is very near the resonance frequency and therefore does not allow for large frequency separations between both of the drive signals and the resonance frequency of the sample. As a consequence, this method is also easily susceptible to drive signal interference and therefore requires rather careful adjustment of the coils in order to minimize the directly induced drive voltage in the receiving coil.

In each of the prior art systems described above, the drive frequency is the same or very near the same frequency as the nuclear resonance frequency. Thus, it is difficult to discriminate between the nuclear signal and the drive contamination picked up by the receiver coil. In the above cited U.S. Pat. No. 3,462,676, the inventors state that many practical difficulties are encountered with higher frequency separations which include direct flux leakage from the modulation coil to the nuclear magnetic resonance receiver coil resulting from the higher power required. It is one goal of the present invention to overcome these difficulties.

It is therefore desirable to provide for an enhanced method and apparatus for producing gyomagnetic resonance in a sample. More particularly, it is desirable to provide for a heterodyne method of producing gyromagnetic resonance which effectively allows for simultaneous observation of the magnetic resonance response from the sample. In addition, it is desirable to provide for such a method which exhibits wide frequency separation between drive signals and the resonance response and is not easily susceptible to drive contamination. It is further desirable to provide for such a method which offers increased measuring capability and the ability to obtain more precise information from the sample.

SUMMARY OF THE INVENTION

In accordance with the teachings of the present invention, a method and apparatus for producing gyromagnetic resonance in a sample are provided herein. A unidirectional static magnetic field is generated for polarizing the sample. A first oscillating magnetic field is applied to the sample with a vector component aligned with the unidirectional static magnetic field. A second oscillating magnetic field is further applied to the sample having a vector component transverse to the unidirectional static magnetic field. A pickup coil detects the resonance response from the sample. The response is then filtered by a bandpass filter and subsequently amplified so as to provide resonance information about the sample.

BRIEF DESCRIPTION OF THE DRAWINGS

Other objects and advantages of the present invention will become apparent to those skilled in the art upon reading the following detailed description and upon reference to the drawings in which.

DETAILED DESCRIPTION OF THE PREFERRED EMBODIMENTS

Figure 1:
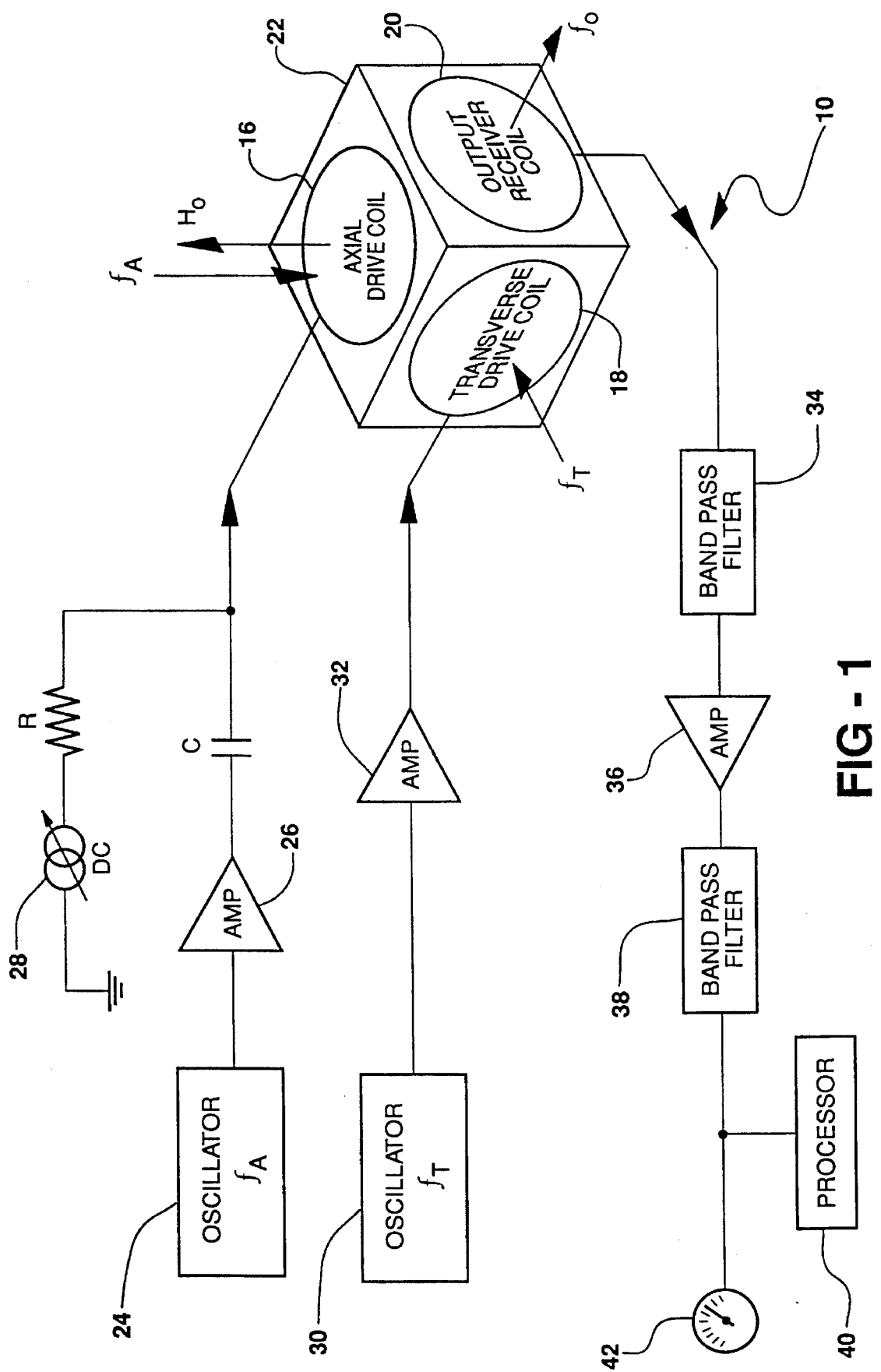
FIG. 1 is a block diagram which illustrates a heterodyne pumping system for producing gyromagnetic resonance in a sample according to one embodiment of the present invention.
Figure 2:
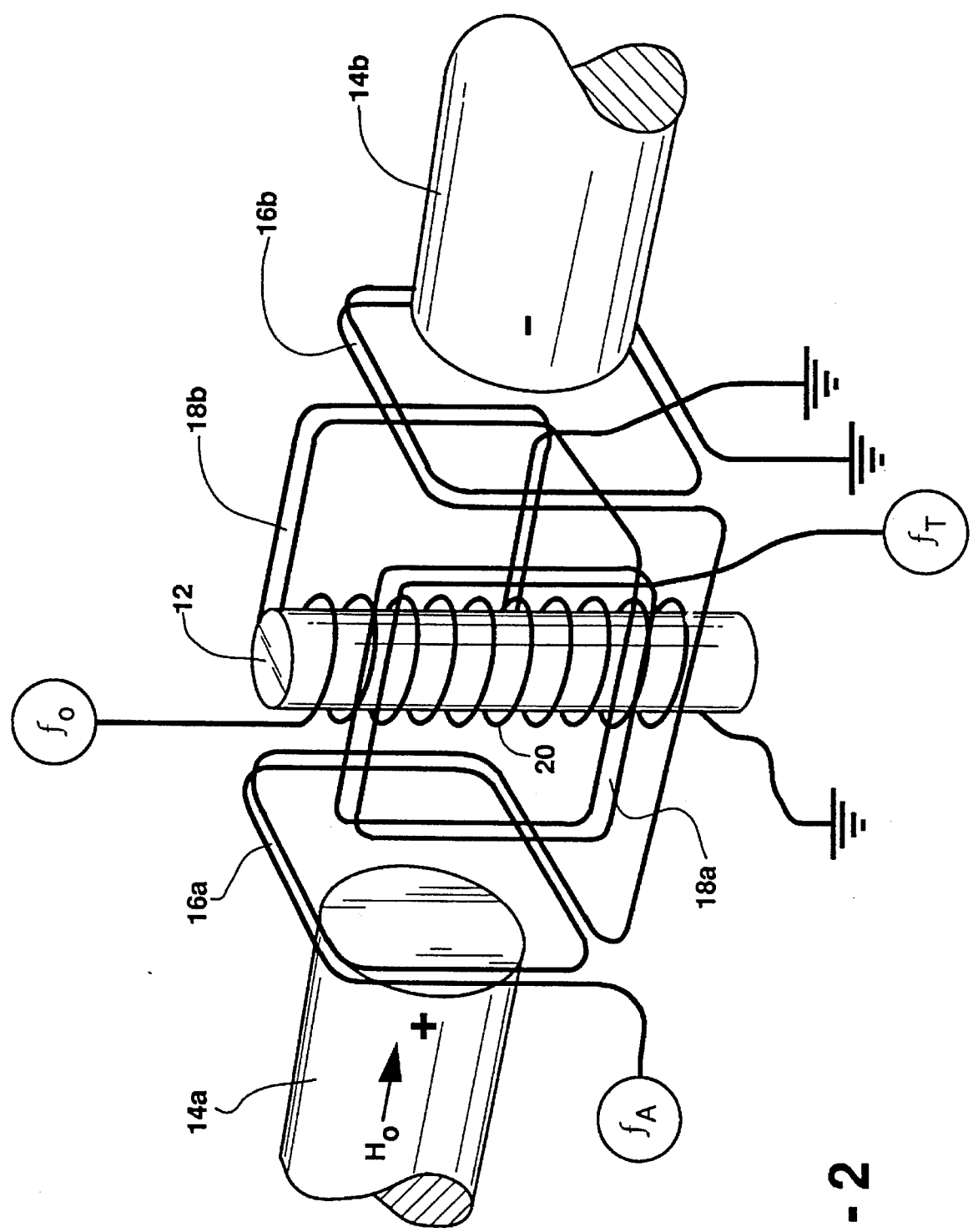
FIG. 2 is a schematic representation of a pair of input drive coils and an output pick-up coil oriented to produce gyromagnetic resonance in a sample in accordance with the present invention.

Turning now to FIGS. 1 and 2, a heterodyne pumping system 10 is shown therein for producing gyromagnetic resonance in a sample 12 according to one embodiment of the present invention. The system 10 described herein actively applies a pair of oscillating magnetic fields to the sample 12 so as to induce a magnetic resonance response from sample 12. The magnetic resonance response in turn is detected and provides information about sample 12. Such information may include the natural resonating frequency of the sample 12 which in turn may enable one to determine the material makeup of sample 12 and transitions found therein. The magnetic resonance information may advantageously be employed in connection with a number of applications which may include but are not limited to a magnetometer, spectrometer or imaging devices such as a microscope or magnetic resonance imaging device.

The heterodyne pumping system 10 employs a strong unidirectional static magnetic field $H_o$ which aligns the nuclei that are present in the sample 12 with an orientation along static magnetic field $H_o$. Static magnetic field $H_o$ is shown generated by a magnet having magnetic pole sections 14a and 14b. As an alternative, for some applications, the earth's magnetic field may suffice to provide the necessary static magnetic field $H_o$. However, it is generally known that a stronger magnetic field will allow for an enhanced signal-to-noise ratio and is therefore generally more desirable.

The heterodyne pumping system 10 includes a pair of orthogonally arranged drive coils 16 and 18 which are oriented orthogonal to one another. For purposes of this description, drive coils 16 and 18 are hereinafter referred to as axial drive coil 16 and transverse drive coil 18, respectively. Together, axial drive coil 16 and transverse drive coil 18 provide a heterodyne magnetic drive mechanism for generating a pair of orthogonally oriented magnetic fields. Axial drive coil 16 includes first and second multiturn coil sections 16a and 16b located on opposite sides of sample 12 and having an axis in the direction of static magnetic field $H_o$.

According to a first embodiment shown in FIG. 1, axial drive coil 16 is coupled to a first oscillator 24 via an amplifier 26 and a blocking capacitor C. First oscillator 24 supplies axial drive coil 16 with an alternating current (AC) electrical signal which has an axial drive frequency $f_A$. Accordingly, axial drive coil 16 electrically induces a first oscillating magnetic field having axial drive frequency $f_A$ in the direction of static magnetic field $H_o$. In effect, the oscillating magnetic field having axial drive frequency $f_A$ may be considered to be modulating the static magnetic field $H_o$ at frequency $f_A$.

In addition, a variable direct current (DC) source 28 and resistor R are further coupled to axial drive coil 16 at a location between capacitor C and coil 16. Variable DC source 28 provides a DC signal to axial coil 16 which may variably increase or decrease the strength of static magnetic field $H_o$. Accordingly, variable DC source 28 may easily change the strength of static magnetic field $H_o$ according to desired operations. Blocking capacitor C is provided for purposes of preventing any unwanted DC signals from reaching amplifier 26 and oscillator 24.

Transverse drive coil 18 has a multiturn coil located near sample 12 with an axis positioned transverse (i.e., perpendicular) to unidirectional static magnetic field $H_o$. Transverse drive coil 18 is coupled to a second oscillator 30 via an amplifier 32. Accordingly, second oscillator 30 supplies a second AC electric signal to transverse drive coil 18 having a transverse drive frequency $f_T$. Transverse drive coil 18 thereby electrically induces an oscillating magnetic field having transverse drive frequency $f_T$ that is oriented perpendicular to both the axial oscillating magnetic field having axial drive frequency $f_A$ and static magnetic field $H_o$.

An output receiver coil 20 is provided for detecting any nuclear magnetic resonance response exhibited by sample 12. Output receiver coil 20 has an axis which is located orthogonal to the axis of transverse drive coil 18 and axial drive coil 16. According to the coil arrangement provided herein, the receiver coil 20 further reduces drive signal interference. This is because the drive signals which are orthogonal thereto generally are not detectable according to such an orthogonal orientation. However, from a practical standpoint it is generally very difficult to obtain exact geometric orthogonality amongst the drive and receiver coils 16, 18 and 20. As a consequence, drive signal interference may be unavoidably detected by receiver coil 20.

Output receiver coil 20 is coupled to a bandpass filter 34 which provides narrow bandpass filtering of the detected magnetic resonance response signal. The bandpass filter 34 has a narrow bandpass frequency range that is selected so as to filter out any unwanted signal interference such as that caused by drive signal contamination. According to the present invention, the passband for filter 34 is selected so as to pass the nuclear resonance signals while simultaneously rejecting both drive frequencies $f_A$ and $f_T$. An amplifier 36 is coupled to the output of the bandpass filter 34 for amplifying the filtered response signal. An optional second bandpass filter 38 may be coupled to the output of amplifier 36 for purposes of further narrowing the bandwidth and thereby reducing any undesirable noise that may be associated with the response signal.

The present invention advantageously filters the received signal prior to any amplification thereof. This is desirable because non-linearities which are commonly associated with amplifiers such as amplifier 36 may create sum and difference frequencies. According to the contamination problem, if both drive frequencies $f_T$ and $f_A$ are applied to amplifier 36, the non-linearities associated with amplifier 36 may produce a signal similar in frequency to the nuclear resonance frequency, thus contaminating the nuclear resonance response signal.

The frequency filtering provided by bandpass filter 34 advantageously allows the nuclear resonant response frequency to pass therethrough while rejecting the drive frequencies $f_T$ and $f_A$. The greater the separation between the nuclear resonant frequency $f_o$ and the drive frequencies $f_T$ and $f_A$, generally the easier it is to build the frequency filtering device 34. For a large separation in frequency, the resonant Q of the conventional receiver coil can provide sufficient frequency filtering. However, it may be appropriate to augment the conventional resonant pickup coil 20 with additional frequency filtering elements such as linear inductors and capacitors and/or linear electromechanical elements which are capable of avoiding the sum and difference frequencies produced by non-linearities.

In determining the amount of frequency separation, a balance must be made between the strength of the drive signals and the complexity of the frequency filter 34. An increase in frequency separation generally requires an increase in the strength of the drive signals which tends to increase the amount of drive contamination. Counterbalancing this is that an increase in the amount of frequency separation generally makes it easier to construct a filter 34 of increased rejection of the drive frequencies. Various applications may benefit more from different frequency selections depending on the amount of frequency separation and the complexity of the available frequency filtering. For a given application, one should choose the frequency separation so as to reduce the drive contamination to an acceptable contamination level.

A processor 40 and output display 42 are shown receiving the amplified and filtered nuclear magnetic resonance response signal for providing processing and display of detected nuclear resonance response information. Processor 40 may be designed to process the response information for purposes related to specific applications which may include analyzing the magnetic nuclear response to detect the resonant frequency of the sample 12 so as to determine the chemical makeup thereof. Processor 40 may be further designed to perform a number of additional processing capabilities which may include processing the response information for purposes of providing magnetic resonance imaging (MRI) among numerous other applications.

In operation, the heterodyne pumping system 10 is properly set up so that a sample 12 is located in unidirectional static magnetic field $H_o$ as provided by magnetic pole sections 14a and 14b. Unidirectional static magnetic field $H_o$ uniformly aligns the nuclei present in sample 12. The axial drive coil 16 is aligned with the unidirectional magnetic field $H_o$, while transverse drive coil 18 and output receiver coil 20 are arranged orthogonal thereto and further to one another. First and second oscillators 24 and 30 are selected to generate first and second oscillating signals which have axial and transverse drive frequencies $f_A$ and $f_T$ which are selected so that the sum or difference thereof is substantially equal to the resonance frequency of the sample 12.

To effectuate excitation of sample 12, the axial oscillating magnetic field and transverse oscillating magnetic field are applied to sample 12 orthogonal to one another. The sample 12 provides a nuclear magnetic resonating response having frequency $f_o$ whenever the sum or difference of the drive frequencies $f_A$ and $f_T$ of the oscillating magnetic fields is substantially equal to the natural resonating frequency that is characteristic of sample 12. When the sum or difference of drive frequencies $f_A$ and $f_T$ are not substantially equal to the resonating frequency, the sample 12 exhibits a very small response at the drive frequency, if any exists.

Output receiver coil 20 receives the resonance response from the sample 12 by detecting a voltage induced thereon. In addition, output receiver coil 20 may be resonated with a capacitor to act as a filtering device for filtering out the axial and transverse drive frequencies $f_A$ and $f_T$ provided by drive coils 16 and 18 which are orthogonal thereto. The resonance response is applied to a first bandpass filter 34 which operates to filter out drive interference which may have been inadvertently detected by output pick up coil 20. In some cases, the frequency filtering provided by the resonant receiver coil 20 may suffice as the bandpass filter 34. The filtered response is subsequently amplified by amplifier 36 and may be further filtered by a second bandpass filter 38. The resulting response signal has a frequency $f_o$ indicative of the resonating frequency characteristic of the sample 12 which may be processed by processor 40 in accordance with a number of applications.

Figure 3:
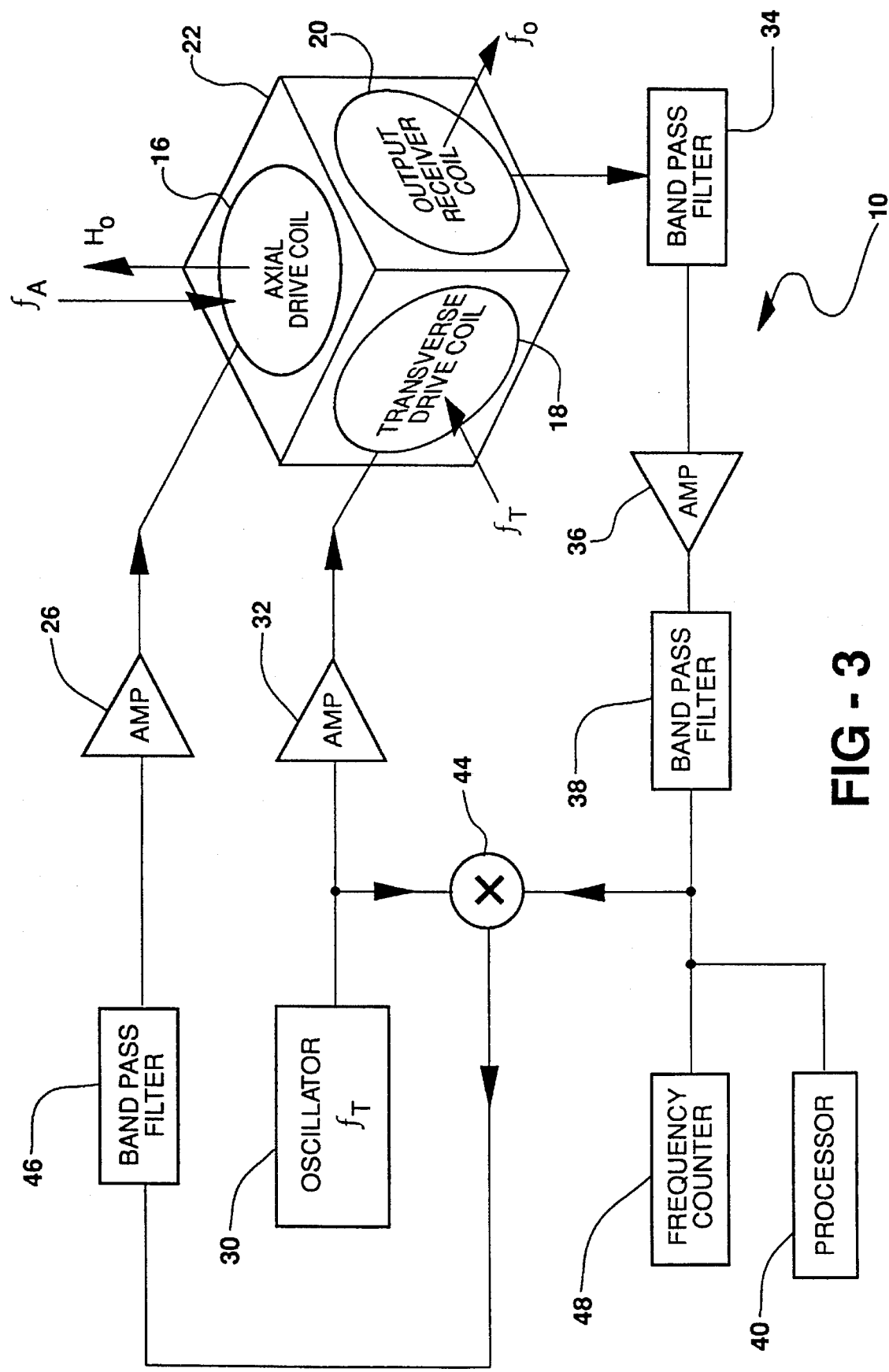
FIG. 3 is a block diagram which illustrates a heterodyne pumping system for producing gyromagnetic resonance in a sample according to a second embodiment of the present invention.

In accordance with a second embodiment of the present invention, the heterodyne pumping system 10 may provide an oscillating system in which frequency is controlled by the nuclear resonant frequency as shown in FIG. 3. For a given material, say for example the protons in water ($H_2O$), the nuclear resonant frequency is determined only by the strength of the DC magnetic field. Therefore, the oscillating system to be described herein is useful for measuring or monitoring the strength of magnetic fields with great accuracy. For example, it is particularly useful for measuring variations of the earth's magnetic field in geophysical research or for measuring and stabilizing strong magnetic fields used in physics, chemistry and medicine.

In accordance with the configuration of the second embodiment as shown in FIG. 3, the heterodyne pumping system 10 is again accomplished by two drive frequencies $f_A$ and $f_T$ applied respectively to the axial coil 16 and transverse coil 18. However, in this embodiment there is only one oscillator 30 which supplies a signal with one drive frequency to one of the coils, such as the transverse coil 18 via amplifier 32. In order that the frequency of oscillation of the system can be determined by the nuclear resonant frequency, the other drive frequency is obtained from the nuclei with suitable processing.

The nuclear resonance output signal at frequency $f_o$ is picked up by the receiver coil 20. This output signal is first filtered by band pass filter 34 which passes the nuclear resonant frequency $f_o$ and rejects the drive frequencies $f_A$ and $f_T$. Then the output signal is amplified by amplifier 36. A second band pass filter 38 may follow amplifier 36, especially in situations where it is desirable to reduce noise by a further reduction of bandwidth. Filter 38 may be of the phase locked loop type using active components which enable the filter to track the frequency of the signal over a frequency range that is relatively large compared to the band pass width of the filter 38. In contrast, filter 34 should contain only passive linear elements in order to avoid the production of a sum or difference of the drive frequencies which would interfere with the nuclear signal and proper operation.

The processing that is used to obtain the axial drive frequency $f_A$ is provided by a mixer 44 which has two inputs and an output. The two inputs to mixer 44 are supplied respectively by oscillator 30 and the output signal from band pass filter 38. These frequencies are $f_T$ and $f_o$, respectively. The mixer output then contains the sum and difference of drive frequency $f_T$ and output frequency $f_o$, namely $f_T+f_o$ and $f_o-f_T$. One combination, such as the difference $f_o-f_T$, is passed by band pass filter 46 which rejects the other combination and also rejects any residual of frequency $f_o$ that may be present. The output from filter 46 is then amplified by amplifier 26 to provide the axial drive signal with frequency $f_A$. Thus, the axial drive frequency $f_A$ is equal to $f_o-f_T$. Accordingly, the sum of the axial and transverse drive frequencies $f_A$ and $f_T$ is equal to frequency $f_o$ so that heterodyne pumping of nuclear resonance takes place and yet the nuclear resonance determines frequency $f_o$ which is the frequency of oscillation of the oscillating system.

The signal out of band pass filter 38 is the output signal of the nuclear resonance controlled oscillating system at frequency $f_o$ which is the nuclear resonance frequency that is determined solely by the magnetic field $H_o$. This signal can be counted by a frequency counter 48 and sent to processor 40 as appropriate for the intended use. As is commonly the case for most oscillators, this oscillating system begins oscillation by amplifying noise which is regenerated and filtered until a full steady state oscillation ensues.

According to the second embodiment, the multiplication of the transverse drive frequency $f_T$ with the output response frequency $f_o$ determines the axial drive frequency $f_A$. The frequency $f_T$ selection is selected so that there exists a wide frequency separation between each of the drive signals and the resonance frequency of the sample 12. Accordingly, only one oscillator is required, while the required wideband frequency separations are maintained.

It will be apparent to those skilled in the art that there are many other ways of obtaining the drive frequencies $f_A$ and $f_T$ from the output nuclear response frequency $f_o$ without departing from the scope of this invention. For example, by processing the output of amplifier 36 using phase locked loop techniques in conjunction with digital techniques, followed by band pass filters, it is easily possible to create the frequencies $\frac{1}{3}f_o$ and $\frac{2}{3}f_o$ which may be used as drive frequencies $f_A$ and $f_T$ to provide the heterodyne drive to pump the nuclear resonance at frequency $f_o$. Accordingly, the frequency of oscillation will be controlled by the nuclear resonance, while frequencies $f_T$ and $f_A$ are derived without an external oscillator. Therefore, operation of the oscillating system can be achieved whenever one or both of the drive frequencies $f_A$ and $f_T$ are derived from frequency $f_o$ and the sum or difference of drive frequencies $f_A$, and $f_T$ is equal to frequency $f_o$.

Figure 4A:
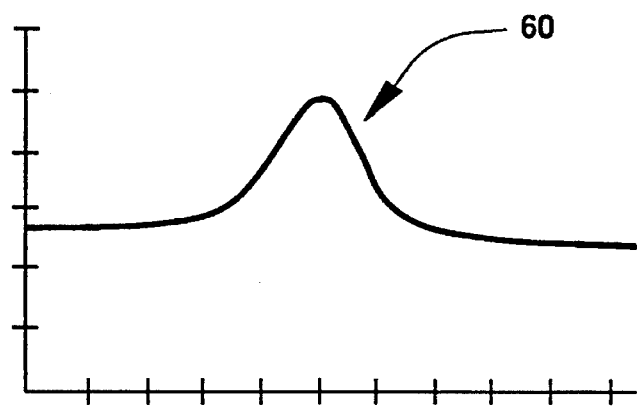
FIGS. 4A through 4C are graphical illustrations of magnetic resonance response signals obtained from a sample produced by the heterodyne pumping system according to one example of the present invention.
Figure 4B:
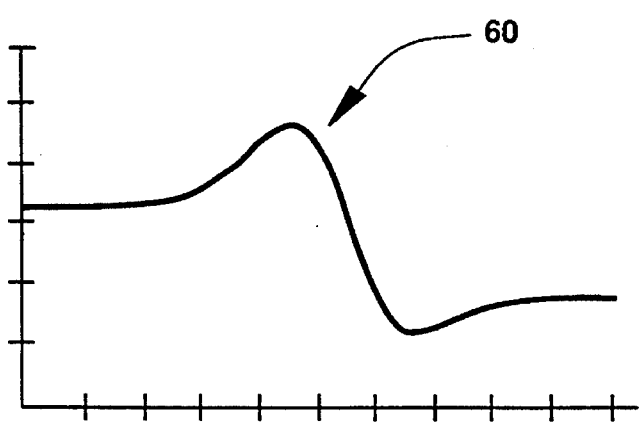
Figure 4C:
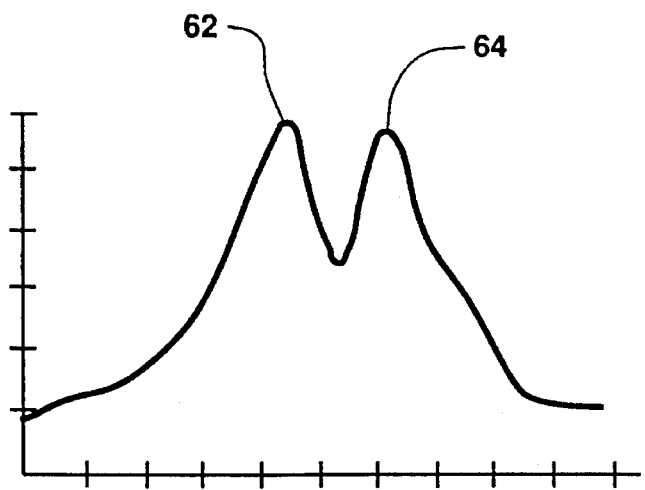

FIGS. 4A through 4C illustrate one example of measured results obtained from an experimental demonstration of the heterodyne pumping described herein according to a spectrometer application. The graphical data provided therein was obtained according to the heterodyne pumping system 10 described in FIG. 1. Sample 12 included a rubber material and the nuclear resonance observed the protons which make up the nuclei of the hydrogen atoms found in rubber. The axial drive frequency $f_A$ was set at approximately three Megahertz (3 Mhz) and the transverse drive frequency $f_T$ was set at approximately four megahertz (4 MHz). The nuclear resonance was therefore approximately seven megahertz (7 MHz). The graphs include a horizontal axis of DC magnetic field $H_o$ and a vertical axis corresponding to the modulus of the 7 MHz signal output from band pass filter 38.

Referring to FIG. 4A, the peak amplitude 60 represents the nuclear resonance response which occurs when the DC current is set to the desired amplitude so as to achieve a nuclear magnetic resonance frequency equal to 7 MHz. As the DC field $H_o$ moves away from this amplitude, the nuclear resonance response essentially falls off. Accordingly, the response shown in FIG. 4A is the sum of the nuclear resonance and a constant 7 MHz signal.

FIG. 4B is similar to 4A with the exception that the added constant 7 MHz signal has been shifted in phase by ninety degrees. FIG. 4C shows the response absent any 7 MHz signal, from which double humped amplitude peaks 62 and 64 are achieved which are the result of the nuclear resonance response alone. The double humps are the result of the drive being larger than a value referred to as saturation. The resulting shape of the curve in FIG. 4B provides useful information, known as relaxation times T1 ad T2, which concern the interaction of the nuclei with neighboring atoms.

While the heterodyne pumping system 10 may advantageously serve as a spectrometer as discussed above, the heterodyne pumping system 10 may also serve as a magnetometer for measuring the intensity of a magnetic field. Proton magnetometers are commonly employed to monitor variations in the magnetic field of the earth, to search for buried objects therein such as ore and oil and further to locate objects such a submarine submerged in water. In contrast to many conventional magnetometers, the present invention may advantageously provide a proton magnetometer which requires less power to operate. In doing so, the magnetometer preferably employs the heterodyne pumping system 10 according to the embodiment shown in FIG. 3 in a manner which requires relatively low power consumption.

According to the proton magnetometer application, the frequency $f_o$ of the oscillating system as shown in FIG. 3 with a known selected sample 12 is employed which has a known natural resonating frequency response. According to a preferred embodiment, water may be employed as the sample 12, since water has protons with a known resonance response frequency of approximately 4257.59 cycles per gauss. Given the system oscillation frequency $f_o$ and known resonating response, one is able to measure the magnetic field $H_o$. This is because the output frequency $f_o$ is proportional to the magnetic field being measured. Accordingly, the magnetometer may advantageously be employed to detect the magnetic field of the earth and small variations thereof simply by observing the frequency of oscillation $f_o$ with a known sample having a known natural resonating response. Using this approach, it is conceivable that the magnetometer may be developed so as to require a relatively low amount of power of approximately one milliwatt (1 MW) or less.

While this invention has been described herein in connection with a particular three-coil arrangement, a number of coil arrangements may be employed without departing from the invention. For instance, either a single or cross-coil magnetic resonance system may be employed. In addition, the present invention may be employed in conjunction with other known magnetic resonance systems for achieving enhanced performance.

In view of the foregoing, it can be appreciated that the present invention enables the user to achieve heterodyne pumping of nuclear magnetic resonance which enables observation during excitation and reduces drive interference. Thus, while this invention has been disclosed herein in combination with a particular example thereof, no limitation is intended thereby except as defined in the following claims. This is because a skilled practitioner recognizes that other modifications can be made without departing from the spirit of this invention after studying the specification and drawings.

What is claimed is:

1. A magnetometer for detecting the intensity of a present magnetic field comprising:

a sample having a known resonance frequency response;

first source means for applying a first oscillating magnetic field having a first frequency to said sample;

second source means for applying a second oscillating magnetic field having a second frequency to said sample in a direction substantially transverse to said first oscillating magnetic field; and receiver means for detecting a frequency response output from the sample which is dependent upon the intensity of a present magnetic field so as to measure the intensity of said present magnetic field.

2. The magnetometer as defined in claim 1 further comprising:

filter means including a passive narrow bandpass filter having a passband frequency range and coupled to said receiver means for filtering the resonance response.

3. The magnetometer as defined in claim 1 further comprising:

mixing means for mixing said first frequency with the frequency response output so as to provide said second oscillating magnetic field.

4. The magnetometer as defined in claim 1 further wherein one of said first and second oscillating magnetic fields is substantially aligned with said present magnetic field.

5. A method for detecting the intensity of a present magnetic field comprising:

selecting a sample having a known resonance frequency response;

applying a first oscillating magnetic field having a first frequency to said sample;

applying a second oscillating magnetic field having a second frequency to said sample in a direction substantially transverse to said first oscillating magnetic field;

detecting a frequency response from the sample; and determining the intensity of the present magnetic field based on the frequency response.

6. A method as defined in claim 5 further comprising filtering the resonance response through a narrow bandpass frequency range.

7. The method as defined in claim 5 further comprising mixing said first frequency with the resonance response frequency so as to provide said second oscillating magnetic field.

8. The method as defined in claim 5 further comprising the step of substantially aligning said magnetic field with one of said first and second oscillating magnetic fields.

9. A magnetometer for detecting the intensity of a present magnetic field comprising:

a sample having a known resonance frequency response;

a first source means for applying a first oscillating magnetic field to said sample in a direction substantially aligned with the static magnetic field, said first magnetic field having a first frequency;

second source means for applying a second oscillating magnetic field having a second frequency to said sample in a direction substantially transverse to said first oscillating magnetic field;

receiver means for detecting a frequency response output from the sample which is dependent upon the intensity of a present magnetic field so as to measure the intensity of said present magnetic field;

filter means including a passive narrow band pass filter having a pass band frequency range and coupled to said receiver means for filtering the resonance response; and wherein each of said first and second frequencies are widely separated from said resonating frequency so that the pass band rejects said first and second frequency and allows resonance signals to pass there through.

* * * * *